(12) United States Patent
Lim et al.

(10) Patent No.: US 10,594,072 B2
(45) Date of Patent: Mar. 17, 2020

(54) DIRECT COUPLING CONNECTOR ASSEMBLY

(71) Applicant: Tyco Electronics AMP Korea Co., Ltd., Gyungsangbuk-do (KR)

(72) Inventors: Kun Taek Lim, Gyeongsangbuk-do (KR); Sang Moon Lee, Gyeongsangbuk-do (KR)

(73) Assignee: Tyco Electronics AMP Korea Co., Ltd., Gyeongsangbuk-Do (KR)

( * ) Notice: Subject to any disclaimer, the term of this patent is extended or adjusted under 35 U.S.C. 154(b) by 0 days.

(21) Appl. No.: 16/170,411

(22) Filed: Oct. 25, 2018

(65) Prior Publication Data

US 2019/0123479 A1 Apr. 25, 2019

(30) Foreign Application Priority Data

Oct. 25, 2017 (KR) .................. 10-2017-0139039
Sep. 7, 2018 (KR) .................. 10-2018-0107242

(51) Int. Cl.
*H01R 13/52* (2006.01)
*H01R 13/621* (2006.01)
(Continued)

(52) U.S. Cl.
CPC ....... *H01R 13/5219* (2013.01); *H01R 12/716* (2013.01); *H01R 13/04* (2013.01); *H01R 13/521* (2013.01); *H01R 13/5202* (2013.01); *H01R 13/6215* (2013.01); *H01R 13/62983* (2013.01); *H05K 5/0069* (2013.01); *H01R 13/10* (2013.01); *H01R 13/748* (2013.01); *H01R 24/76* (2013.01); *H01R 2107/00* (2013.01); *H01R 2201/26* (2013.01); *H05K 5/0082* (2013.01)

(58) Field of Classification Search
CPC ............ H01R 13/6215; H01R 13/5202; H01R 13/5219
See application file for complete search history.

(56) References Cited

U.S. PATENT DOCUMENTS 3,159,444 A 12/1964 Stine, Jr.
4,684,190 A 8/1987 Clark et al.
(Continued)

OTHER PUBLICATIONS

Extended European Search Report, European Patent Application No. 18201727.7, dated Feb. 14, 2019, 10 pages.

*Primary Examiner* — Tho D Ta
(74) *Attorney, Agent, or Firm* — Barley Snyder

(57) ABSTRACT

A female connector is mountable to an electronic module having a printed circuit board. The female connector comprises a female connector body, a plurality of female taps, an inner seal, a coupling nut disposed in the female connector body, and a female O-ring. The female connector body includes a female flange having a female bolting hole configured to couple with the electronic module and a female protrusion protruding from the female flange. The female taps each include a pin extending through the female connector body and connectable to the printed circuit board and a receptor connected to an end of the pin. The inner seal is disposed in the female protrusion and is configured to be in contact with a male connector that couples with the female connector. The female O-ring surrounds the female protrusion and is disposed in an outer wall of the female protrusion.

16 Claims, 13 Drawing Sheets

(51) Int. Cl.

| | | |
|---|---|---|
| *H05K 5/00* | (2006.01) | |
| *H01R 13/04* | (2006.01) | |
| *H01R 13/629* | (2006.01) | |
| *H01R 12/71* | (2011.01) | |
| *H01R 13/10* | (2006.01) | |
| *H01R 107/00* | (2006.01) | |
| *H01R 24/76* | (2011.01) | |
| *H01R 13/74* | (2006.01) | |

(56) References Cited

U.S. PATENT DOCUMENTS

| | | | | |
|---|---|---|---|---|
| 5,266,047 A | * | 11/1993 | Black | H01R 13/631 |
| | | | | 439/364 |
| 5,630,731 A | * | 5/1997 | Sawada | H01R 13/5208 |
| | | | | 439/274 |
| 5,743,756 A | * | 4/1998 | Hasz | H01R 13/4367 |
| | | | | 439/364 |
| 6,443,764 B2 | * | 9/2002 | Makita | H01R 13/5219 |
| | | | | 439/271 |
| 6,520,788 B2 | * | 2/2003 | Ichida | H01R 13/5219 |
| | | | | 439/271 |
| 6,896,535 B2 | * | 5/2005 | Yamada | H01R 12/714 |
| | | | | 439/289 |
| 9,048,572 B2 | * | 6/2015 | Shibata | F16B 35/048 |
| 2011/0053404 A1 | | 3/2011 | Tsuruta et al. | |
| 2011/0182694 A1 | | 7/2011 | Nishikawa et al. | |

\* cited by examiner

DIRECT COUPLING CONNECTOR ASSEMBLY

CROSS-REFERENCE TO RELATED APPLICATION

This application claims the benefit of the filing date under 35 U.S.C. § 119(a)-(d) of Korean Patent Application No. 2017-10-0139039, filed on Oct. 25, 2017, and Korean Patent Application No. 2018-10-0107242, filed on Sep. 7, 2018.

FIELD OF THE INVENTION

The present invention relates to a direct coupling connector assembly and, more particularly, to a direct coupling connector assembly for forming an electrical connection between a pair of modules.

BACKGROUND

A connector is an electrical part that selectively forms an electrical connection, that is, selectively connects or disconnects electricity. The connector may connect two different modules. For example, the connector may be mounted to a suspension and a wheel of a vehicle and may electrically connect the suspension and the wheel. The connector may require a sealing structure to prevent an external material from penetrating between two modules or to prevent fluid provided in a module from leaking to the outside. For example, a vehicular connector needs to have a sealing structure for preventing oil provided in a suspension from leaking to the outside and also needs to have a sealing structure for preventing fluid from flowing in through wheels during driving.

SUMMARY

A female connector is mountable to an electronic module having a printed circuit board. The female connector comprises a female connector body, a plurality of female taps, an inner seal, a coupling nut disposed in the female connector body, and a female O-ring. The female connector body includes a female flange having a female bolting hole configured to couple with the electronic module and a female protrusion protruding from the female flange. The female taps each include a pin extending through the female connector body and connectable to the printed circuit board and a receptor connected to an end of the pin. The inner seal is disposed in the female protrusion and is configured to be in contact with a male connector that couples with the female connector. The female O-ring surrounds the female protrusion and is disposed in an outer wall of the female protrusion.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
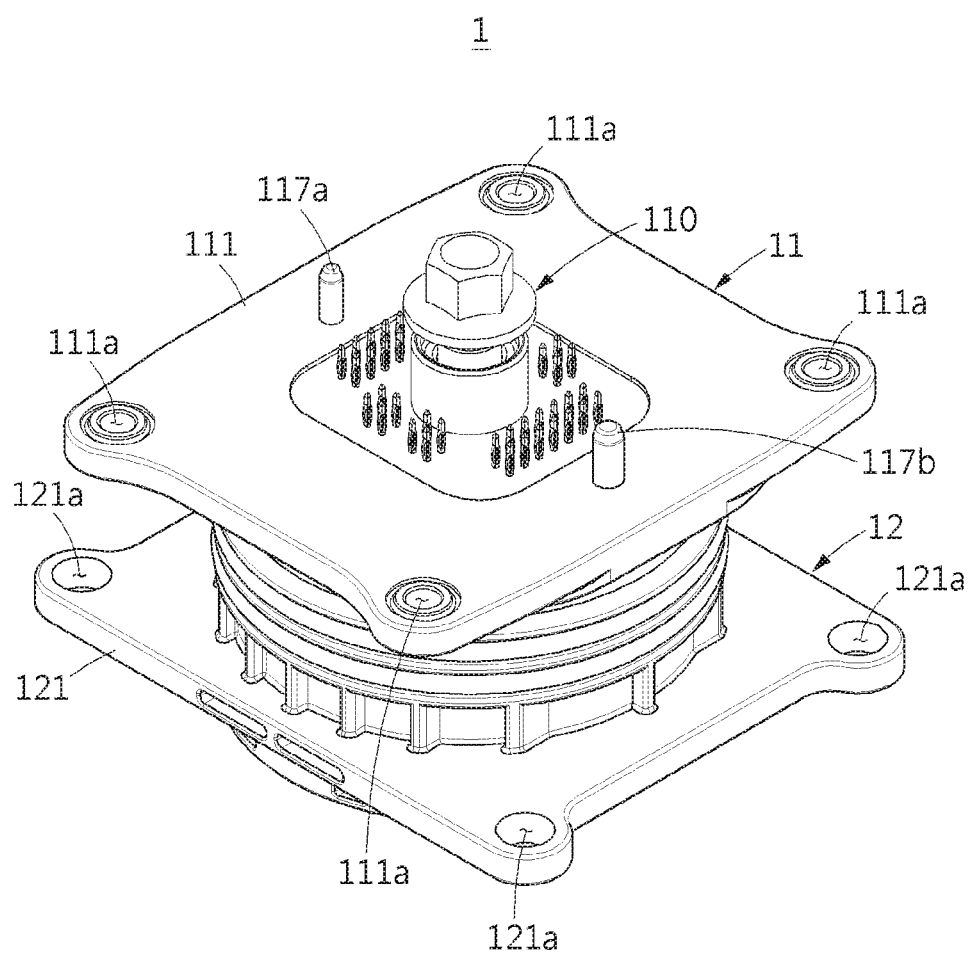
FIG. 1 is a perspective view of a direct coupling connector assembly according to an embodiment.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

In addition, terms such as first, second, A, B, (a), (b), and the like may be used herein to describe components. Each of these terminologies is not used to define an essence, order or sequence of a corresponding component but used merely to distinguish the corresponding component from other component(s). It should be noted that if it is described in the specification that one component is "connected", "coupled", or "joined" to another component, a third component may be "connected", "coupled", and "joined" between the first and second components, although the first component may be directly connected, coupled or joined to the second component.

A component having a common function with a component included in one example embodiment is described using a like name in another example embodiment. Unless otherwise described, a description made in one example embodiment may be applicable to another example embodiment and a detailed description within a duplicate range is omitted.

A direct coupling connector assembly 1 according to an embodiment is shown in FIGS. 1-5. The direct coupling connector assembly 1 forms a direct electrical connection between two modules, for example, a first module M1 and a second module M2 shown in FIGS. 3 and 4. The direct coupling connector assembly 1 includes a male connector 11 that may be mounted to the first module M1 and a female connector 12 that may be mounted to the second module M2. Either connector 11, 12 that couples with the other connector 11, 12 may be referred to as a mating connector.

An operator may implement physical and electrical connection between the two modules M1 and M2 using two connectors, for example, the male connector 11 and the female connector 12 that are assembled to the first module M1 and the second module M2, respectively, without using an intermediate wire coupling operation on the first module M1 and the second module M2. That is, the direct coupling connector assembly 1 does not require a separate module for connection. Through the above operation, the direct coupling connector assembly 1 may physically and electrically connect the two modules M1 and M2 and may also seal the same from an outside. The direct coupling connector assembly 1 prevents fluid from flowing in the first module M1 to which the male connector 11 is mounted and the second module M2 to which the female connector 12 is mounted. The direct coupling connector assembly 1 further prevents the fluid provided in the first module M1 and the second module M2 from flowing out to the outside.

Figure 3:
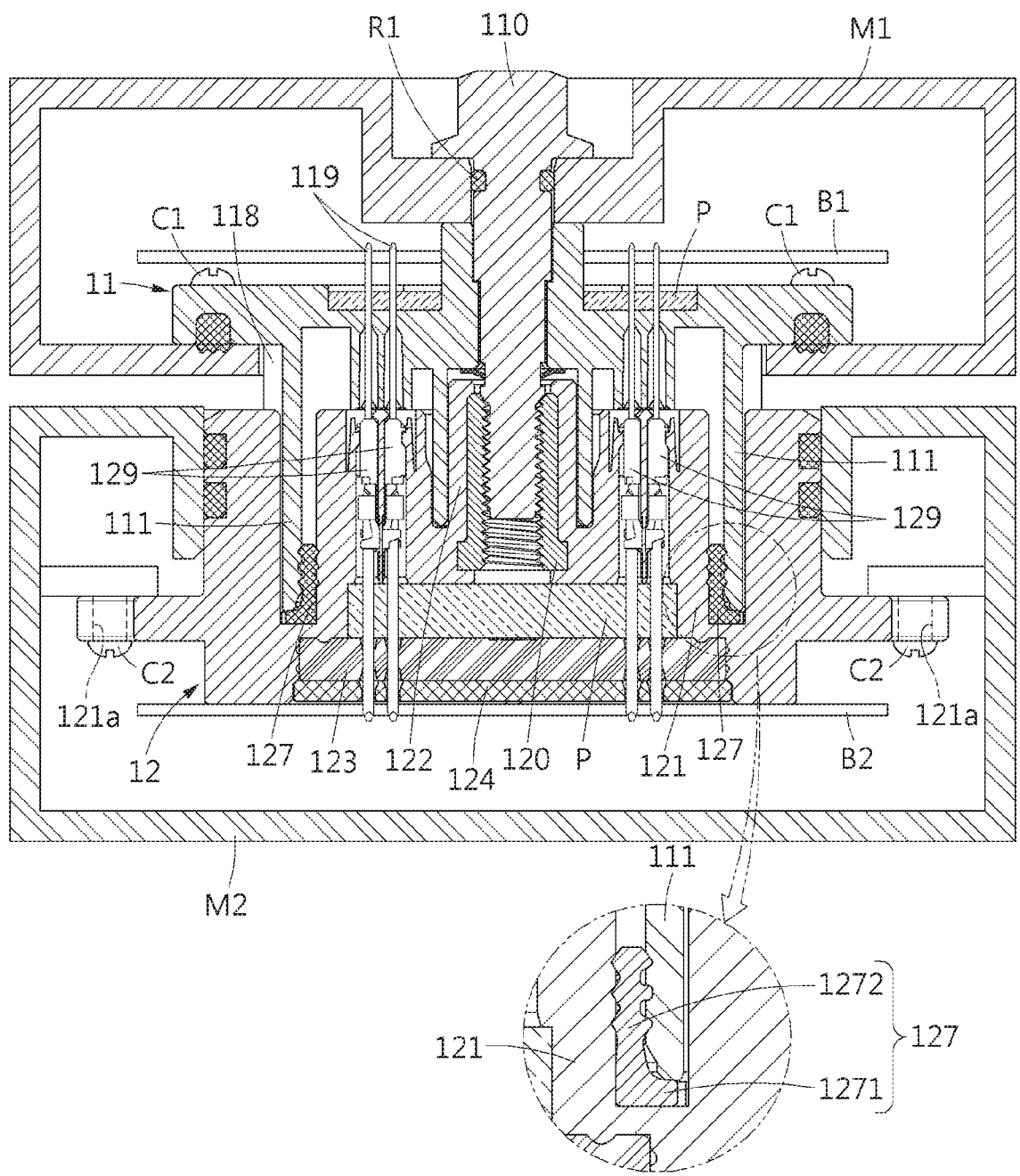
FIG. 3 is a sectional side view of the direct coupling connector assembly.

A coupling O-ring R1 provided to a coupling bolt 110, as shown in FIG. 3, is in a shape that surrounds the coupling bolt 110. The coupling bolt 110 includes a coupling groove extending into the coupling bolt 110 in a direction perpendicular to a lengthwise direction and configured to support the coupling O-ring R1. The coupling O-ring R1 prevents fluid from flowing into the first module M1 from the outside by sealing between the male connector 11 and the coupling bolt 110.

Figure 2:
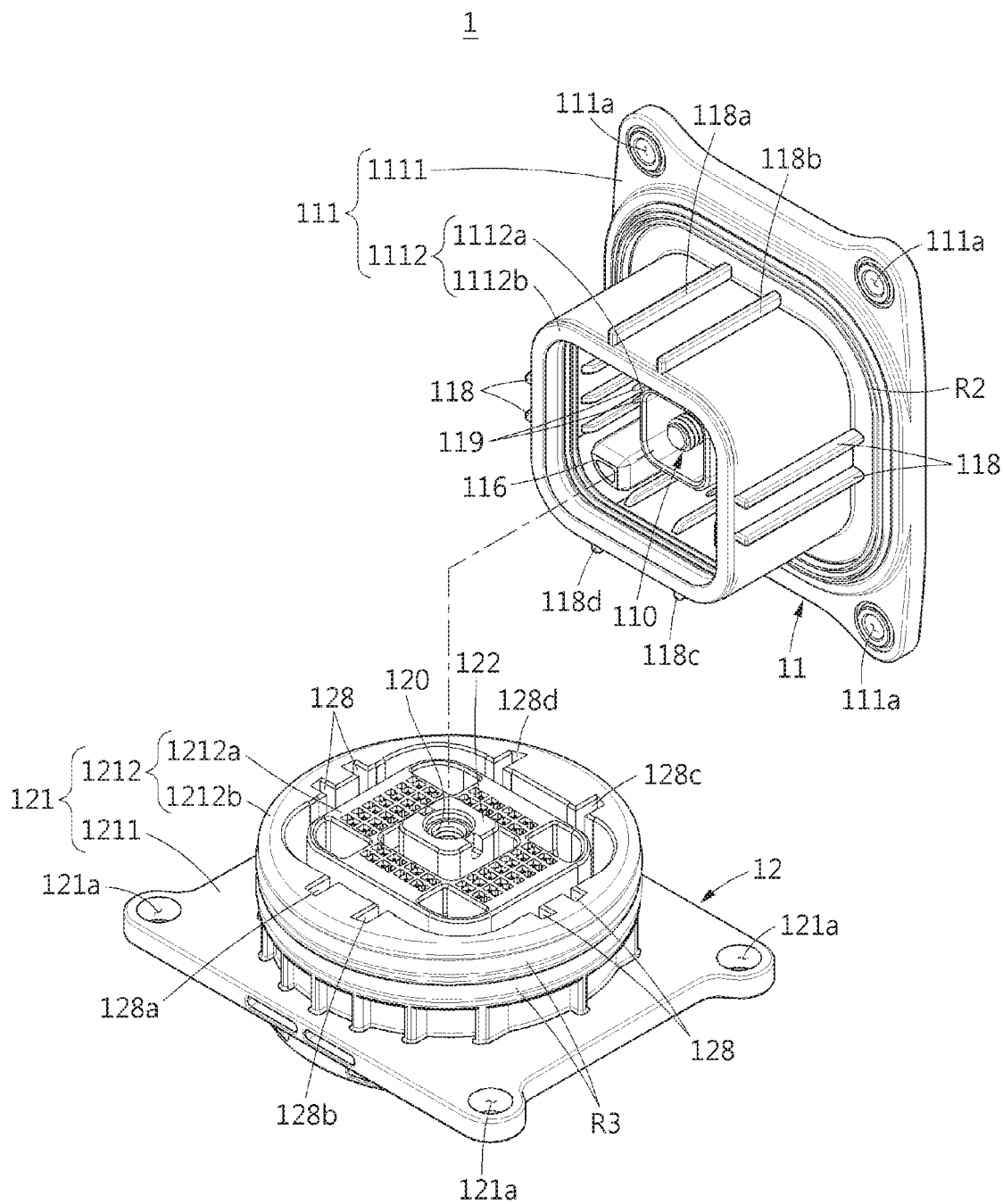
FIG. 2 is an exploded perspective view of the direct coupling connector assembly.
Figure 4:
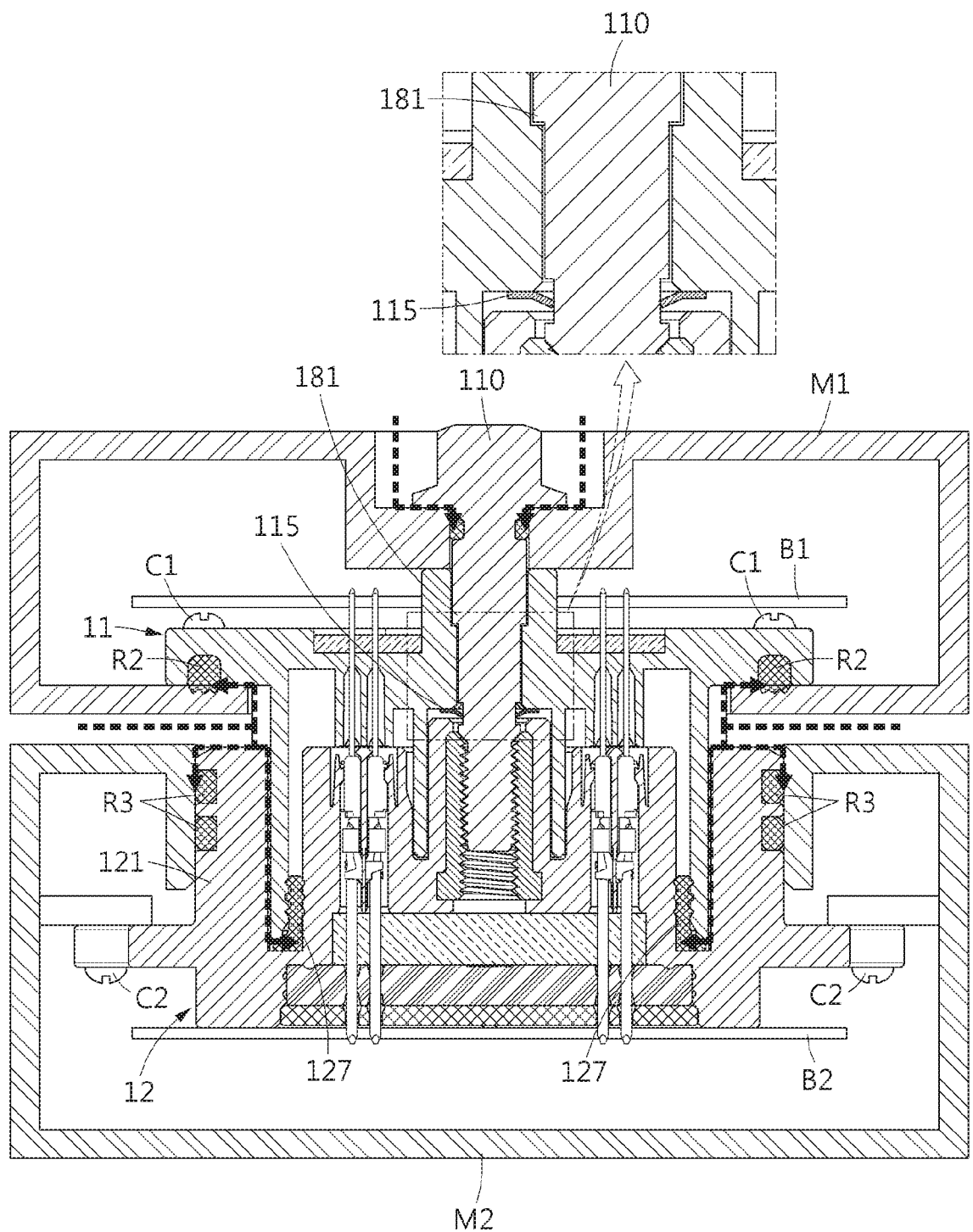
FIG. 4 is a sectional side view of a sealing structure of the direct coupling connector assembly.

A male O-ring R2, shown in FIGS. 2 and 4, provided on a male connector body 111 of the male connector 11 prevents fluid from flowing in the first module M1 through a space between the male connector 11 and the female connector 12 by sealing between the male connector body 111 and the first module M1. For example, the male O-ring R2 may be supported in a state in which at least a portion of the male O-ring R2 is inserted into a male flange 1111 of the male connector body 111.

A female O-ring R3, shown in FIGS. 2 and 4, provided along an outer circumference of a female connector body 121 of the female connector 12 prevents fluid from flowing in the second module M2 through the space between the male connector 11 and the female connector 12 by sealing between the female connector body 121 and the second module M2. For example, the female O-ring R3 may be supported in a state in which at least a portion of the female O-ring R3 is inserted into an outer wall of a female protrusion 1212 of the female connector body 121.

An inner seal 127, as shown in FIGS. 3, 4, and 7-12, prevents fluid from flowing in the female connector 12 from the outside.

The first module M1 and the second module M2 may be electrically connected. In an embodiment, the first module M1 includes a first printed circuit board (PCB) B1, and the second module M2 includes a second PCB B2 as shown in FIGS. 3 and 4. The direct coupling connector assembly 1 connects the first PCB B1 and the second PCB B2. For example, the first module M1 may be a transmission controller unit (TCU) module of a vehicle and the second module M2 may be an electronic module (E-module) that couples with the first module M1. In general, the first module M1 and the second module M2 may be referred to as electronic modules.

The male connector 11 couples with the female connector 12. As shown in FIGS. 3 and 4, the male connector 11 may electrically and physically connect to the first module M1 including the first PCB B1 and the female connector 12 may electrically and physically connect to the second module M2 including the second PCB B2. Two different modules M1, M2 may be electrically connected through electrical and physical connection between the male connector 11 and the female connector 12.

The male connector 11, as shown in FIGS. 1-4, includes the male connector body 111, a deviation preventer 115, a male body protrusion 116, a plurality of coupling rods 117a and 117b, the coupling bolt 110, a plurality of ribs 118, and a male tap 119.

The male connector body 111 engage with the female connector 12. The male connector body 111 may slide along the female connector 12 in one direction. The male connector body 111 may support the male tap 119. When the male connector 11 faces the female connector 12 in a coupling direction with the female connector 12, the male tap 119 may be in a line with a female tap 129 provided on the female connector 12. For coupling between the male connector 11 and the female connector 12, the male connector body 111 may protrude toward the female connector 12 further than the male tap 119 based on a state in which the male connector 11 faces the female connector 12. In this case, a portion that surrounds the male tap 119 in the male connector body 111 may initially insert into the female connector 12 before the male tap 119. Through the above structure, the male connector body 111 prevents the male tap 119 from inserting into an erroneous location and thereby being damaged. The male connector body 111 includes a male flange 1111 and a male protrusion 1112 as shown in FIG. 2.

The male flange 1111, as shown in FIGS. 1 and 2, includes a plurality of male bolting holes 111a configured to couple the male connector 11 and the first module M1. For example, a first bolt C1 shown in FIGS. 3 and 4 fastens the male connector 11 to the first module M1 through screw-connection of the male bolting hole 111a and the first module M1. The male flange 1111 may support the male O-ring R2. The male O-ring R2 may be positioned on one surface of the male flange 1111 that faces the female connector 12.

The male protrusion 1112, as shown in FIG. 2, protrudes from the male flange 1111 and is inserted into the female connector 12. The male protrusion 1112 includes an inner male protrusion 1112a and an outer male protrusion 1112b. The inner male protrusion 1112a may insert into an inner side of an inner female protrusion 1212a of the female connector body 121. That is, the inner male protrusion 1112a may insert between the inner female protrusion 1212a and a coupling nut 120. The outer male protrusion 1112b may insert between the inner female protrusion 1212a and an outer female protrusion 1212b of the female connector body 121.

The deviation preventer 115 prevents the coupling bolt 110 from being deviated in a first direction, for example, upward in FIG. 4. The deviation preventer 115 is inserted into a groove dented between a screw portion and a head portion of the male connector body 111 of the coupling bolt 110. For example, for easy manufacture, the deviation preventer 115 may be present within a space between the coupling nut 120 and a bottom surface of the male connector body 111 based on a state in which the male connector 11 and the female connector 12 are coupled with each other as shown in FIG. 4. The deviation preventer 115 may be a washer that is provided as a part separate from the male connector body 111. The coupling bolt 110 may include a pressing portion 181 formed on an outer wall of the coupling bolt 110 and configured to press the male connector body 111 and to prevent the coupling bolt 110 from being deviated in a second direction, for example, downward in FIG. 4, which is opposite to the first direction. For example, the pressing portion 181 may be received in a stepped portion that is formed in the male connector body 111 and may prevent the coupling bolt 110 from being deviated in the second direction. The deviation preventer 115 and the pressing portion 181 may assist the coupling bolt 110 to be rotatable in place relative to the male connector body 111.

The male body protrusion 116, as shown in FIG. 2, protrudes from the male flange 1111 between the inner male protrusion 1112a and the outer male protrusion 1112b, and may insert into a groove formed in the inner female protrusion 1212a. The male body protrusion 116 may assist the male tap 119 and the female tap 129 to couple with each other in an aligned state. An end of the male body protrusion 116 that is most distant from the male flange 1111 may have a shape that becomes narrower further from the male flange 1111. According to the above shape, the male body protrusion 116 is insertable into the inner female protrusion 1212a even though the male body protrusion 116 is not perfectly aligned with the inner female protrusion 1212a.

The outer male protrusion 1112b primarily guides an insertion direction of the male tap 119, the inner male protrusion 1112a secondarily guides the insertion direction of the male tap 119, and the male body protrusion 116 tertiarily guides the insertion direction of the male tap 119. Through the above structure, it is possible to prevent the male tap 119 from being deformed due to the end of the female tap 129 in response to coupling between the male connector 11 and the female connector 12.

A plurality of coupling rods 117a and 117b protrude from the male connector body 111, as shown in FIG. 1, and may be aligned with the plurality of male taps 119. For example, the plurality of coupling rods 117a and 117b may include a first coupling rod 117a and a second coupling rod 117b each having a different diameter. A diameter of the first coupling rod 117a may be less than a diameter of the second coupling rod 117b. For example, the first PCB B1 mounted to the male connector 11 may include holes, each having a different diameter, through which the first coupling rod 117a and the second coupling rod 117b may pass. The plurality of coupling rods 117a and 117b prevent the first PCB B1 from being erroneously assembled to the male connector 11.

A plurality of ribs 118, as shown in FIGS. 2 and 3, protrude from a sidewall of the male connector body 111. For example, when the male connector 11 is structured to insert into an inner side of the female connector 12, each of the plurality of ribs 118 protrudes outward from the outer wall of the male connector body 111. When the male connector 11 inserts into an outer side of the female connector 12, that is, when the male connector 11 is structured to surround and couple with the female connector 12, the plurality of ribs 118 protrude inward from the inner wall of the male connector body 111. The female connector 12 includes a plurality of rib receiving grooves 128 configured to receive the plurality of ribs 118, respectively. The plurality of ribs 118 may slide along the plurality of rib receiving grooves 128, respectively.

Among at least a portion of the plurality of ribs 118, an interval between neighboring ribs may differ from an interval between another set of neighboring ribs. For example, as shown in FIG. 2, the plurality of ribs 118 may include a first rib 118a and a second rib 118b formed on a first sidewall of the male connector body 111 and a third rib 118c and a fourth rib 118d formed on a second sidewall of the male connector body 111. An interval between the first rib 118a and the second rib 118b may be greater than or less than an interval between the third rib 118c and the fourth rib 118d. Through the above structure, it is possible to prevent the male connector 11 and the female connector 12 from coupling in an erroneous direction other than an originally intended direction.

Although description is made based on an example in which the plurality of ribs 118 is formed in the male connector 11, in another embodiment, the female connector 12 may include a plurality of ribs and the male connector 11 may include a plurality of rib receiving grooves. In a further embodiment, the male connector 11 may include a plurality of ribs and a plurality of rib receiving grooves and the female connector 12 may include a plurality of rib receiving grooves and a plurality of ribs corresponding thereto.

The male tap 119 shown in FIGS. 2 and 3 may be provided on the male connector body 111. The male tap 119 may pass through the male connector body 111. One end of the male tap 119 may connect to the first PCB B1 that is provided in the first module M1. The male tap 119 may directly couple with the female tap 129 that is provided in the female connector 12. In an embodiment, a plurality of male taps 119 may be provided. The male tap 119 may electrically connect to the first PCB B1 that is connected to the male connector body 111, and a potting material P may be potted on a portion that penetrates the male connector body 111 for waterproofing.

The coupling bolt 110 may connect to the male connector 11 to be rotatable in place, and may couple the male connector 11 and the female connector 12 as shown in FIGS. 3 and 4. The coupling bolt 110 may have threads engaging the coupling nut 120 of the female connector 12. Hereinafter, description is made based on a state in which the male connector 11 is fastened to be immovable relative to the first module M1 and the female connector 12 is fastened to be immovable relative to the second module M2.

When the coupling bolt 110 rotates in one direction through engagement with the coupling nut 120, the coupling bolt 110 may move closer to the female connector 12 along the coupling nut 120 and the pressing portion 181 of the coupling bolt 110 may press the stepped portion that is formed in the male connector body 111. In this manner, the male connector 11 and the female connector 12 may couple with each other. During the above process, the first module M1 and the second module M2 fastened to the male connector 11 and the female connector 12, respectively, move closer to each other and are physically and electrically connected.

On the contrary, when the coupling bolt 110 rotates in a direction opposite to the one direction, the coupling bolt 110 moves away from the female connector 12 and the deviation preventer 115 inserted into the dented groove of the coupling bolt 110 may lift the male connector body 111 to move away from the female connector 12. In this manner, coupling between the male connector 11 and the female connector 12 is released. During the above process, the first module M1 and the second module M2 fastened to the male connector 11 and the female connector 12, respectively, are separated from each other and are physically and electrically disconnected.

Figure 6:
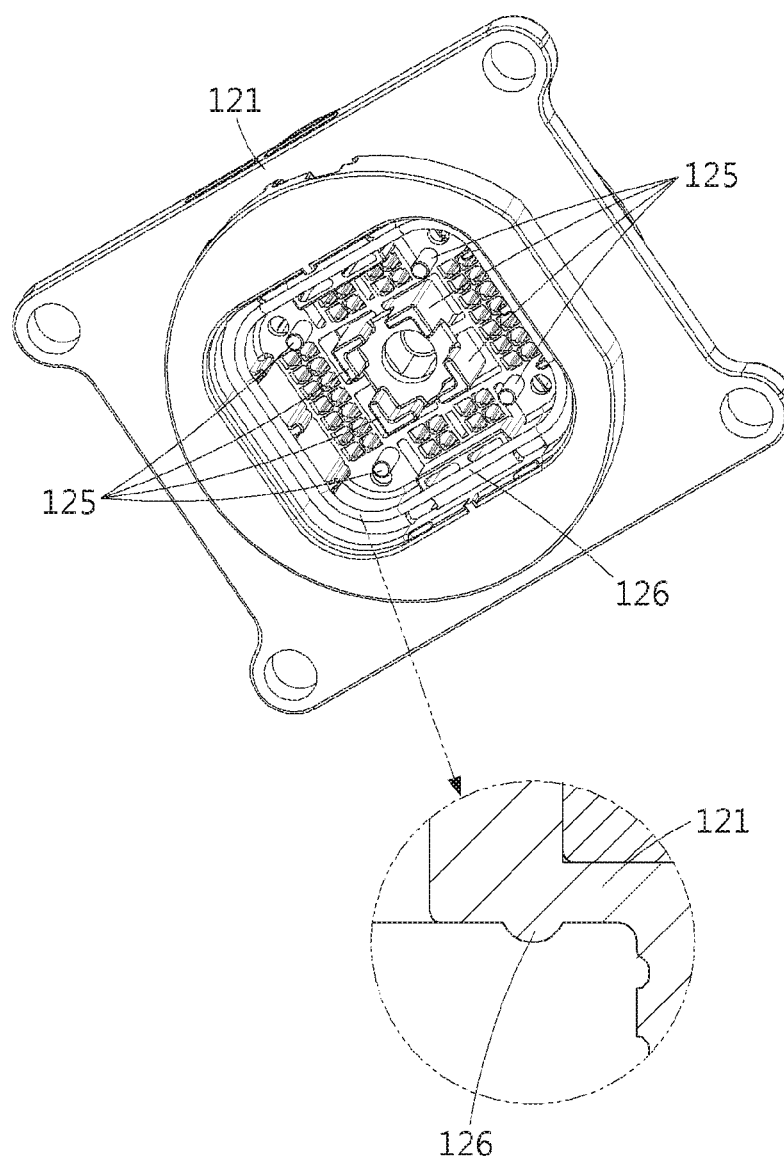
FIG. 6 is a bottom perspective view of a female connector according to an embodiment.
Figure 7:
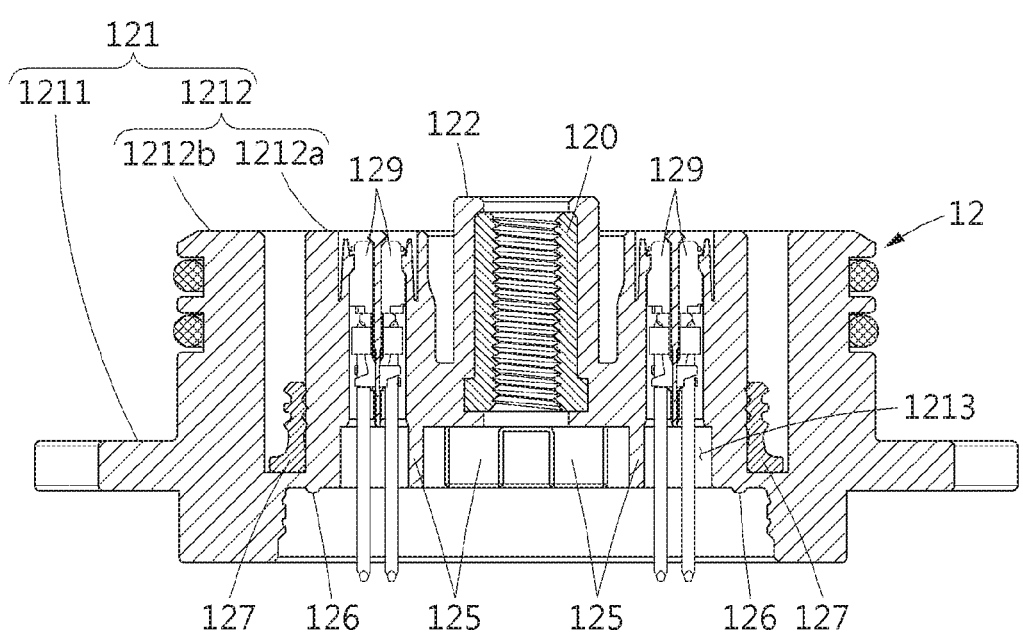
FIG. 7 is a sectional side view of the female connector in a state in which a family seal and a seal holder of the female connector are separate.

The female connector 12, as shown in FIGS. 1-4, includes the female connector body 121, a support 122, a family seal 123, a seal holder 124, a support rod 125 shown in FIG. 7, a protrusion 126 shown in FIG. 7, the inner seal 127, the coupling nut 120, the plurality of rib receiving grooves 128, and the female tap 129. The seal holder 124, the support rod 125, and the protrusion 126 will be further described with reference to FIGS. 6-8.

The female connector body 121 engages with the male connector body 111. The female connector body 121 slides along the male connector body 111 in one direction. The female connector body 121 supports the female tap 129. For coupling between the female connector 12 and the male connector 11, the female connector body 121 protrudes toward the male connector 11 further than the female tap 129 based on a state in which the female connector 12 faces the male connector 11. The female connector body 121 include a female flange 1211, the female protrusion 1212, and a female potting portion 1213 shown in FIG. 7.

The female flange 1211 includes a plurality of female bolting holes 121a, shown in FIGS. 1 and 2, configured to couple the female connector 12 and the second module M2. For example, a second bolt C2 shown in FIG. 3 may fasten the female connector 12 to the second module M2 through screw-connection of the female bolting hole 121a and the second module M2.

The female protrusion 1212, as shown in FIG. 2, protrudes from the female flange 1211 and is inserted into the male connector 11. The female protrusion 1212 include a groove for supporting the female O-ring R3 on an outer wall. The female protrusion 1212 may include the inner female protrusion 1212a and the outer female protrusion 1212b. The inner female protrusion 1212a is separate from the support 122 and has a shape that surrounds an outer side of the support 122 and protrudes from the female flange 1211. The outer female protrusion 1212b is separate from the inner female protrusion 1212a and has a shape that surrounds an outer side of the inner female protrusion 1212a and protrudes from the female flange 1211.

As shown in FIG. 7, the female potting portion 1213 is disposed in a space between the female protrusion 1212 and the family seal 123. In a state in which the family seal 123 is provided to close one surface of the female potting portion 1213, the potting material P may be potted on the female potting portion 1213.

The support 122, as shown in FIGS. 2, 3, 7, and 8, is disposed at a center of the female connector body 121. The support 122 may protrude highest from a center of the female flange 1211 and may support the coupling nut 120 and guide the coupling bolt 110. The inner seal 127 is disposed on the female connector body 121 and is in contact with at least a portion of the male connector body 111. For example, the inner seal 127 may be provided to a portion of the female connector body 121 into which the male connector body 111 inserts. The inner seal 127 may be in a ring shape. While the coupling bolt 110 is moving toward the female connector 12 by rotating through engagement with the coupling nut 120, as shown in FIGS. 9-12, the inner seal 127 may be pressed and compressed by the male connector body 111. The inner seal 127 may be formed of a flexible material having elasticity. The inner seal 127 may prevent fluid from penetrating between the male connector 11 and the female connector 12. The inner seal 127 may insert into the female connector body 121 in an extended state. The inner seal 127 may further closely attach to the female connector body 121 with a restoration force. For example, the inner seal 127 may be in a closed-ring shape and thereby may prevent fluid from flowing in the female connector body 121 from the outside in all directions.

The inner seal 127, as shown in FIG. 3, may include a first seal part 1271 and a second seal part 1272. The first seal part 1271 may be in contact with one end of the male connector 11, for example, the male protrusion 1112. In an embodiment, the first seal part 1271 may be in contact with the outer male protrusion 1112b. For example, the first seal part 1271 may be provided on the female connector body 121 in a direction perpendicular to a progress direction of the male connector 11. The first seal part 1271 may absorb a vibration in a direction parallel to a coupling direction among vibrations that are transferred from the male connector body 111 to the female connector body 121, or transferred from the female connector body 121 to the male connector body 111. The second seal part 1272 may extend vertically from the first seal part 1271, and may be in contact with the male connector 11, for example, the inner wall of the male protrusion 1112. In an embodiment, the second seal part 1272 is in contact with the inner wall of the outer male protrusion 1112b. The second seal part 1272 may be provided along one surface of the female connector body 121. The second seal part 1272 may be provided in an inner side of the male connector body 111 when the male connector body 111 couples with the female connector body 121. The second seal part 1272 may be deformed to be inward due to the male connector body 111. The second seal part 1272 may absorb a vibration in a crossing direction relative to the coupling direction among vibrations that are transferred from the male connector body 111 to the female connector body 121, or transferred from the female connector body 121 to the male connector body 111.

The aforementioned shape of the inner seal 127 is provided as an example only. In another embodiment, based on a cross-section of the inner seal 127, an outer portion of the inner seal 127 may be in a further protruding shape compared to an inner portion of the inner seal 127. Alternatively, the inner portion and the outer portion of the inner seal 127 may be in a further protruding shape compared to a center portion of the inner seal 127.

The plurality of rib receiving grooves 128 may receive the plurality of ribs 118, respectively. The plurality of rib receiving grooves 128 may include, for example, a first rib receiving groove 128a, a second rib receiving groove 128b, a third rib receiving groove 128c, and a fourth rib receiving groove 128d as shown in FIG. 2. An interval between the first rib receiving groove 128a and the second rib receiving groove 128b may be greater than an interval between the third rib receiving groove 128c and the fourth rib receiving groove 128d.

The female tap 129 is disposed on the female connector body 121, as shown in FIGS. 3, 4, 7, and 8. The female tap 129 may pass through the female connector body 121. One end of the female tap 129 connects to the second PCB B2 that is provided in the second module M2. The female tap 129 may directly couple with the male tap 119 that is provided in the male connector 11. In an embodiment, a plurality of female taps 129 may be provided. The female tap 129 may electrically connect to the second PCB B2 that is connected to the female connector body 121.

Figure 5:
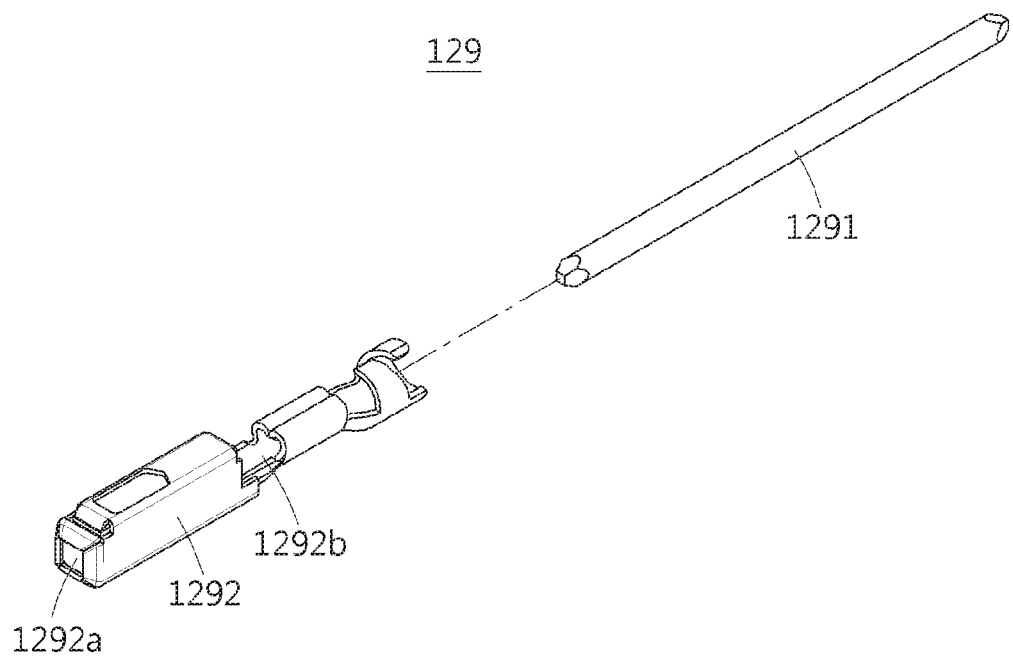
FIG. 5 is an exploded perspective view of a female tap according to an embodiment.

The female tap 129, as shown in FIG. 5, includes a pin 1291 and a receptor 1292. The pin 1291 has an elongated bar shape. For example, both ends of the male tap 119 may be configured using a pin only. The pin 1291 directly connects to the second PCB B2, and may be supported by the female connector body 121. The receptor 1292 connects to an end of the pin 1291 and receives at least a portion of the male tap 119. For example, the receptor 1292 includes an opening part 1292a configured to connect to the male tap 119 and a fastening part 1292b configured to become narrower further away from the opening part 1292a and to fasten to the pin 1291. The fastening part 1292b may be fastened with the pin 1291 through pressing or soldering. Although description is made based on an example in which the female tap 129 includes the pin 1291 and the receptor 1292, and the male tap 119 is configured using a pin, it is provided as an example only. In another embodiment, the male tap 119 may include a pin and a receptor, and the female tap 129 may include a pin.

Figure 8:
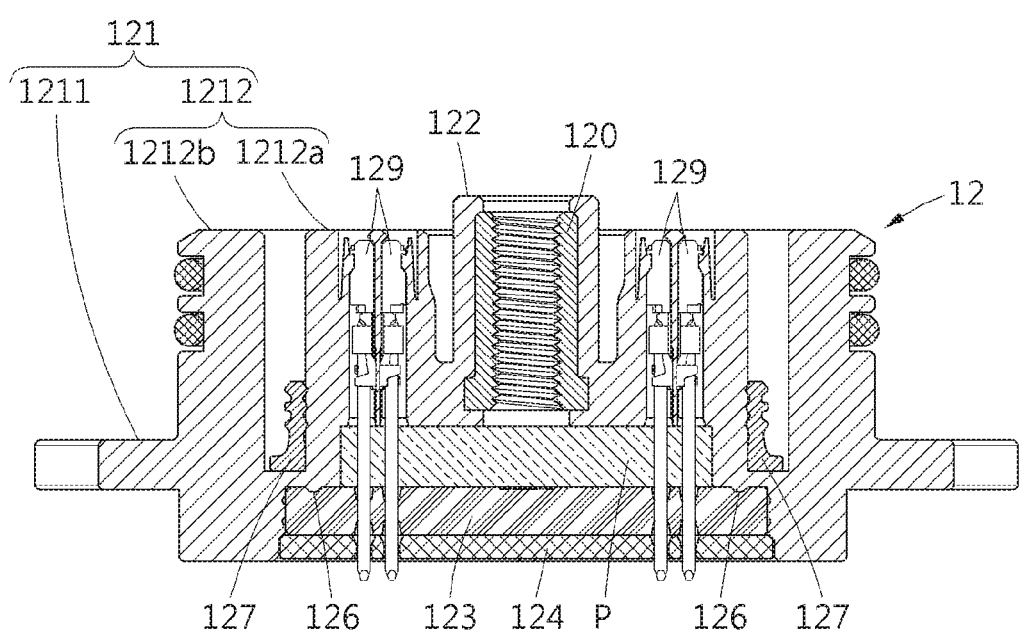
FIG. 8 is a sectional side view of the female connector.

As shown in FIGS. 6-8, the female connector 12 includes the female connector body 121, the family seal 123, the seal holder 124, the support rod 125, the inner seal 127, and the female tap 129.

The family seal 123, as shown in FIG. 8, is inserted into the female connector body 121. The family seal 123 has elasticity and may be pressed and thereby compressed by the female connector body 121 when inserted into the female connector body 121. The family seal 123 includes a plurality of holes configured to support the female tap 129. A sectional area of the plurality of holes may be less than that of the female tap 129. When the female tap 129 passes through the family seal 123, the family seal 123 may be compressed and the female tap 129 may be pressed by the family seal 123. The family seal 123 may seal the female connector body 121 to prevent the potting material P from leaking to the outside while the potting material P is being injected into the female connector body 121.

The seal holder 124, as shown in FIG. 8, is inserted into the female connector body 121 and may support the family seal 123. The seal holder 124 prevents the family seal 123 from being separate from the female connector body 121. The seal holder 124 includes a plurality of holes configured to support the female tap 129. A sectional area of the seal holder 124 may be greater than or equal to that of the female tap 129. The seal holder 124 may be formed using a rigid material compared to that of the family seal 123. Through the above structure, the seal holder 124 may assist the female tap 129 to in physically readily coupling with the male tap 119 by accurately aligning a position of the female tap 129.

The support rod 125, as shown in FIGS. 6 and 7, protrudes from the female connector body 121 and supports the family seal 123. The support rod 125 protrudes from the female connector body 121 in a direction opposite to a direction in which the female connector 12 faces the male connector 11. That is, the support rod 125 protrudes from the female connector body 121 in a direction that becomes distant from the male connector 11. The female potting portion 1213 is disposed in a space between the family seal 123 and the female connector body 121 by way of the support rod 125. The potting material P may fill in the female potting portion 1213. A plurality of support rods 125 may be provided. The plurality of support rods 125 may be separate from each other. The potting material P to be injected into the female connector body 121 may move afloat between the plurality of support rods 125.

The protrusion 126, as shown in FIGS. 6-8, protrudes from the female connector body 121 and may be inserted into the family seal 123. The protrusion 126 may be, for example, in a ring-shaped protrusion. The protrusion 126 may insert into the family seal 123 and may implement further secure sealing between the female connector body 121 and the family seal 123. The family seal 123 may include a groove in a shape corresponding to a shape of the protrusion 126.

A coupling process of the direct coupling connector assembly 1 is shown in FIGS. 9-12.

As shown in FIGS. 9-12, the female connector body 121 may include a plurality of body holes 1211a. The plurality of body holes 1211a may be provided to face the seal holder 124 based on the family seal 123, and may be formed to penetrate the female connector body 121 in a direction perpendicular to the family seal 123.

The plurality of body holes 1211a may be provided, for example, in a circumferential direction of the support 122. The user may verify whether an appropriate amount of potting material fills in the female potting portion 1213 through the plurality of body holes 1211a. In an exemplary embodiment, four body holes 1211a may be provided in the circumferential direction of the support 122. In a state in which the seal holder 124 is inserted into the female connector body 121, the user may observe the remaining body hole(s) 1211a while filling the potting material in the female connector body 121 through one or more body holes 1211a. Once a sufficient amount of potting material fills in a lower portion of each of the plurality of body hole 1211a, the potting material may pass through the body hole 1211a. The user may initially verify whether the potting material passes the four body holes 1211a and then determine whether the potting material appropriately fills therein. In addition, the potting material flows over the body hole 1211a and may form a buffing portion with a predetermined thickness in an inner side of the female connector body 121 in a portion that contacts with the male connector body 111, thereby preventing a vibration of the female connector 12.

The male connector 11 and the female connector 12 couple with each other as described below.

Figure 9:
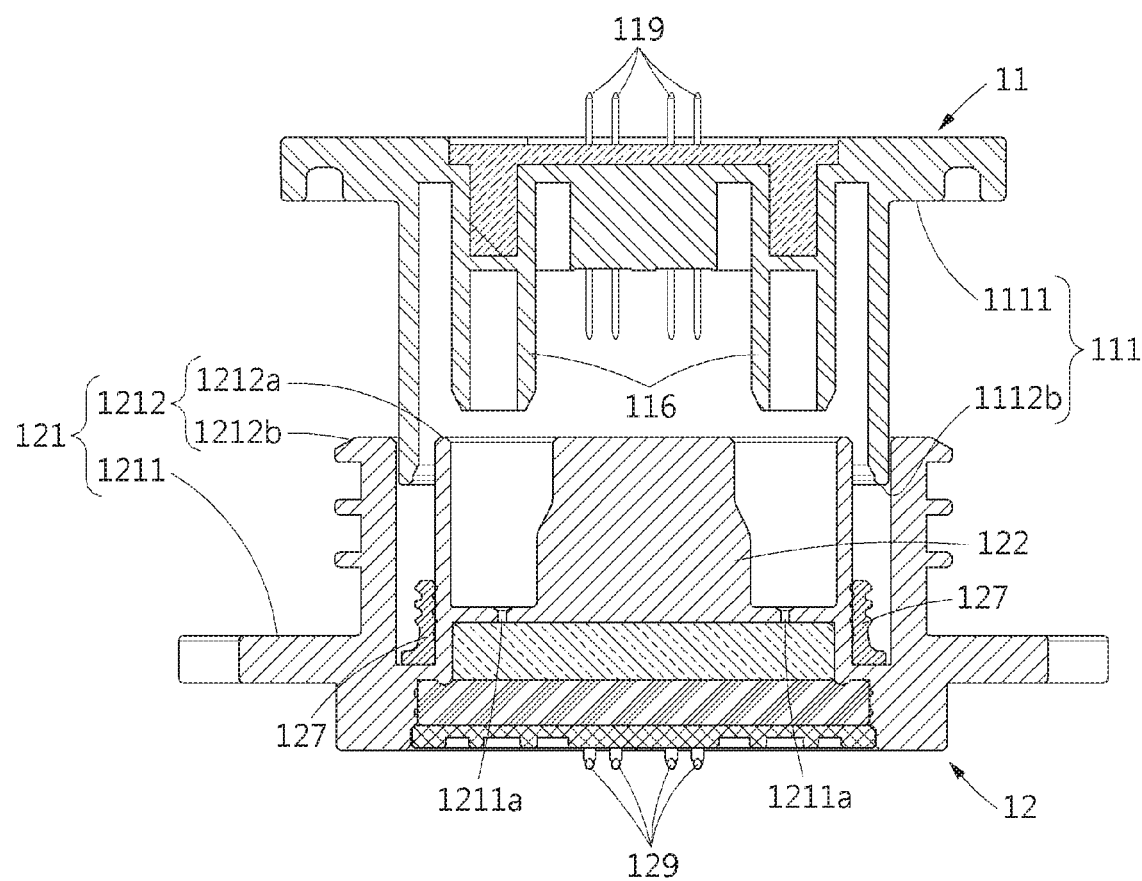
FIG. 9 is a sectional side view of the direct coupling connector assembly in a first state.

In a state shown in FIG. 9, the male connector 11 and the female connector 12 are not in contact with each other. As shown in FIG. 9, the outer male protrusion 1112b is inserted along an inner side of the outer female protrusion 1212b. During this process, the male tap 119 and the female tap 129 may be aligned. The user may easily recognize a coupling direction based on the shape of the outer male protrusion 1112b and the outer female protrusion 1212b, for example, the plurality of ribs 118 and the plurality of rib receiving grooves 128. The outer female protrusion 1112b may be separate from the inner female protrusion 1212a. The male tap 119 may approach the female tap 129. Here, the male body protrusion 116 is not in contact with the female connector 12. As described above, prior to this operation, appropriate filling of the potting material may be verified through the body hole 1211a. In another embodiment, the male flange 1111 and the female flange 1211 may be installed in different modules, respectively.

Figure 10:
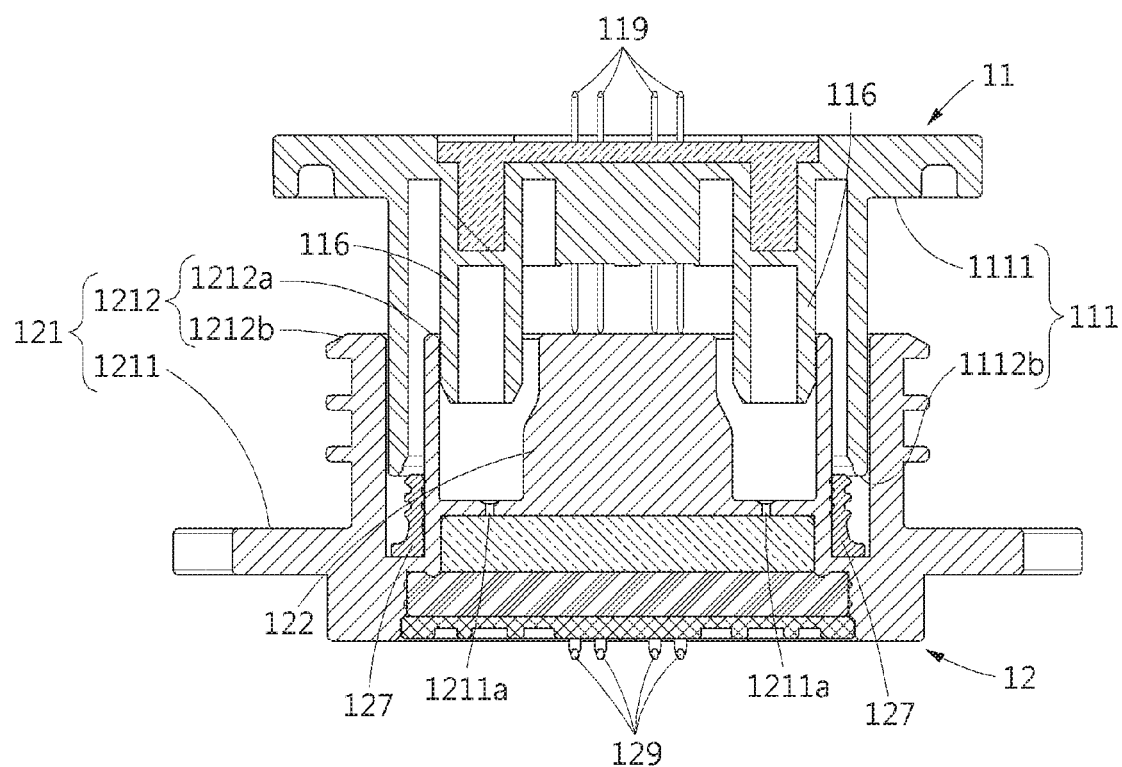
FIG. 10 is a sectional side view of the direct coupling connector assembly in a second state.

As shown in FIG. 10, the male body protrusion 116 is inserted into the inner female protrusion 1212a. In the state shown in FIG. 10, a portion of the male connector body 111 is in contact with a portion of the female connector body 121. During this process, the male tap 119 and the female tap 129 may be further accurately aligned.

Figure 11:
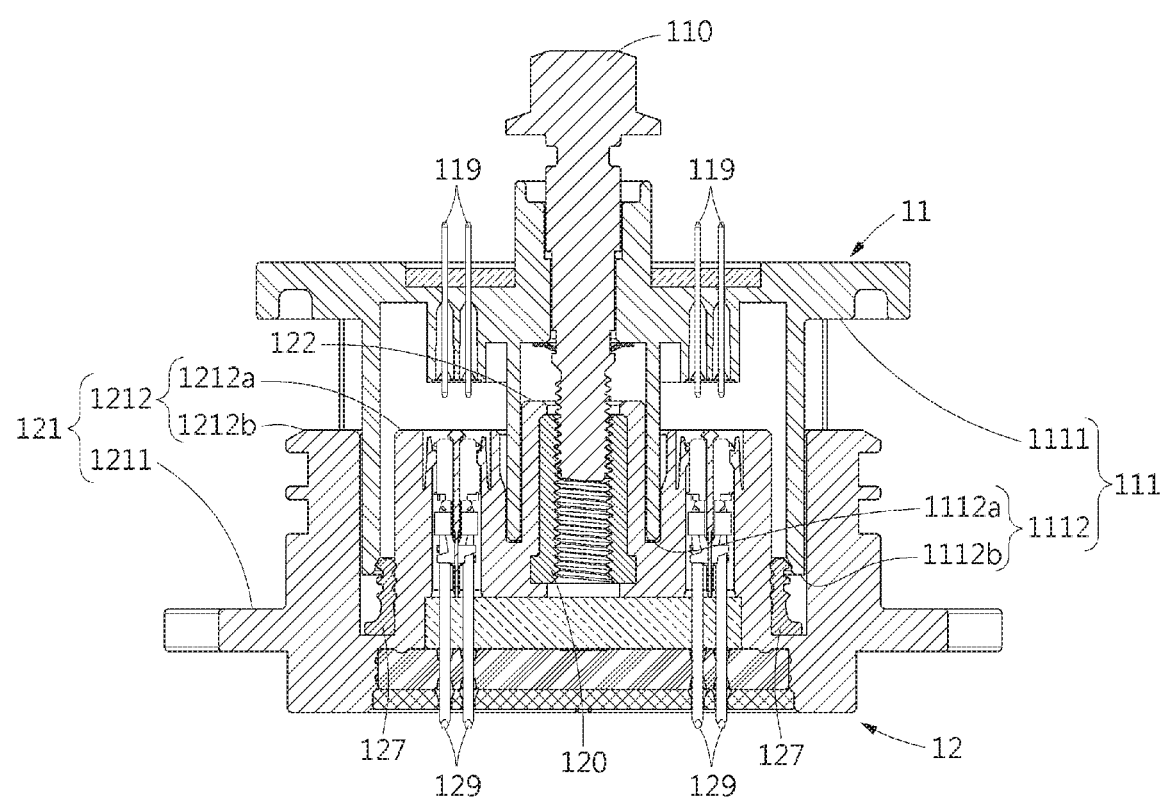
FIG. 11 is a sectional side view of the direct coupling connector assembly in a third state.

FIG. 11 shows a state in which the coupling bolt 110 is received in the coupling nut 120. As shown in FIG. 11, an end of the coupling bolt 110 may be received in the coupling nut 120. During this process, the male tap 119 and the female tap 129 may be further accurately aligned.

Figure 12:
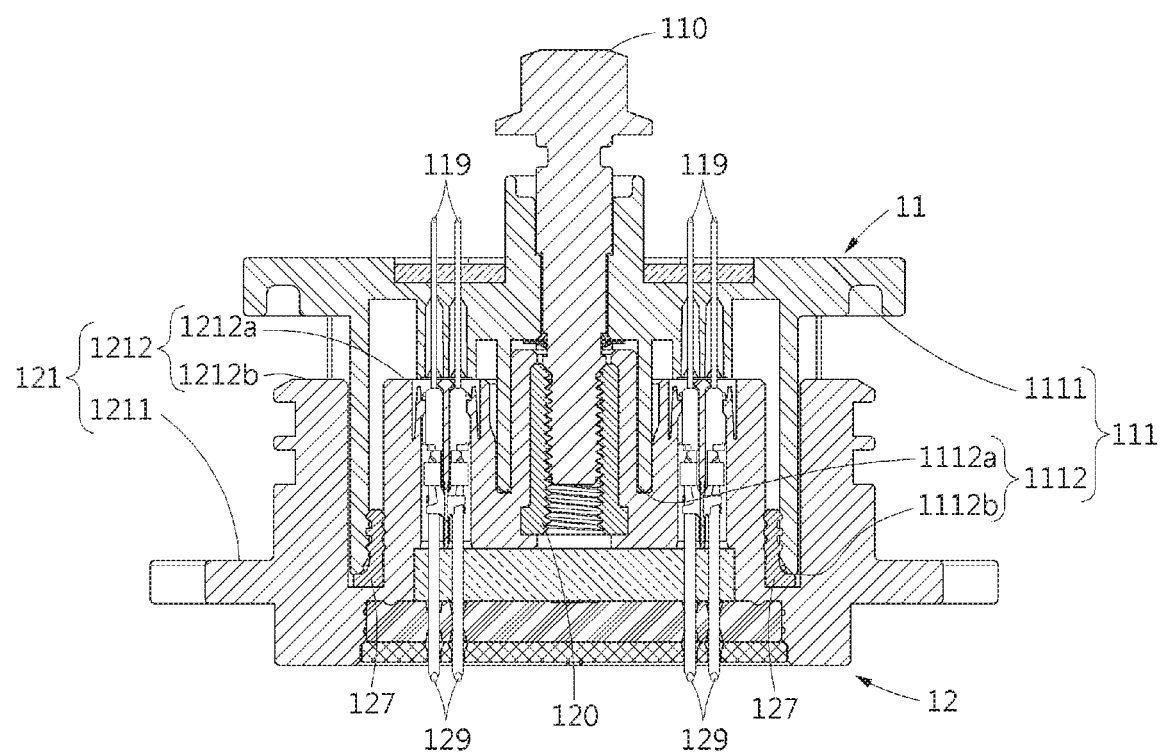
FIG. 12 is a sectional side view of the direct coupling connector assembly in a completely coupled state.

FIG. 12 shows a state in which the coupling bolt 110 rotates and the male connector 11 and the female connector 12 are completely coupled. As the coupling bolt 110 rotates relative to the male connector 11, the male connector 11 and the female connector 12 may couple with each other. During progress of coupling, the male tap 119 is inserted into the female tap 129.

Figure 13:
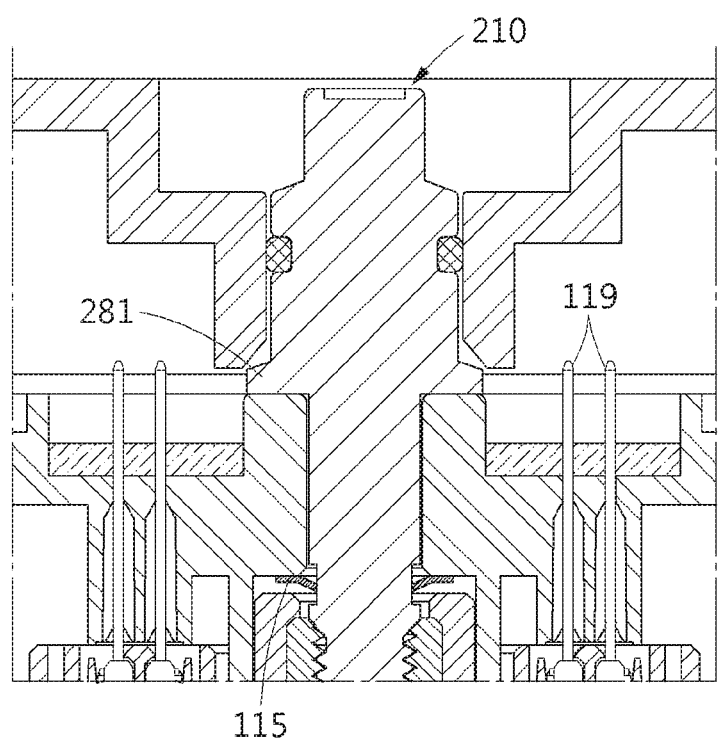
FIG. 13 is a sectional side view of a coupling bolt of a direct coupling connector assembly according to another embodiment.

A coupling bolt 210 according to another embodiment is shown in FIG. 13. The coupling bolt 210 may include a pressing portion 281 configured to protrude from an outer wall. The pressing portion 281 prevents the coupling bolt 210 from being deviated in one direction, for example, downward in FIG. 13. The pressing portion 281 may be received on a top surface of the male connector body 111 and may prevent the coupling bolt 210 from being deviated in the second direction. The deviation preventer 115 and the pressing portion 281 may assist the coupling bolt 210 to be rotatable in place relative to the male connector body 111.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A female connector mountable to an electronic module having a printed circuit board, the female connector comprising:
    a female connector body including a female flange having a female bolting hole configured to couple with the electronic module and a female protrusion protruding from the female flange;
    a plurality of female taps each including a pin extending through the female connector body and connectable to the printed circuit board and a receptor connected to an end of the pin;
    an inner seal disposed in the female protrusion and configured to be in contact with at least a portion of a male connector that couples with the female connector;
    a coupling nut disposed in the female connector body;
    a female O-ring surrounding the female protrusion and disposed in an outer wall of the female protrusion; and
    a support provided at a center of the female connector body and configured to support the coupling nut, the female protrusion includes an inner female protrusion separate from the support, surrounding an outer side of the support, and protruding from the female flange, and an outer female protrusion separate from the inner female protrusion and surrounding the inner female protrusion, the inner seal is disposed between the inner female protrusion and the outer female protrusion.

2. The female connector of claim 1, wherein the inner seal includes a first seal part contacting an end of the male connector and a second seal part vertically extending from the first seal part and contacting an inner wall of the male connector.

3. The female connector of claim 1, further comprising a family seal inserted into the female connector body and elastically supporting the plurality of female taps, and a seal holder inserted into the female connector body, supporting the family seal, and supporting the plurality of female taps.

4. The female connector of claim 3, further comprising a support rod protruding from the female connector body and supporting the family seal to provide a space between the female connector body and the family seal.

5. A male connector mountable to an electronic module having a printed circuit board, the male connector comprising:
    a male connector body including a male flange having a male bolting hole configured to couple with the electronic module and a male protrusion protruding from the male flange, the male protrusion includes an inner male protrusion protruding from the male flange and an outer male protrusion separate from the inner male protrusion and surrounding the inner male protrusion;
    a plurality of male taps penetrating the male connector body and connectable to the printed circuit board;
    a coupling bolt connected to the male connector body and rotatable in place, the inner male protrusion is separate from the coupling bolt; and
    a male O-ring surrounding the male protrusion and disposed in the male flange.

6. The male connector of claim 5, further comprising a coupling O-ring surrounding the coupling bolt, the coupling bolt includes a coupling groove extending into the coupling bolt in a direction perpendicular to a lengthwise direction of the coupling bolt and supporting the coupling O-ring.

7. The male connector of claim 5, further comprising a male body protrusion protruding from the male flange and having an end that becomes narrower further from the male flange.

8. The male connector of claim 5, further comprising a deviation preventer configured to prevent the coupling bolt from being deviated in a first direction relative to the male connector body, the coupling bolt includes a pressing portion formed on an outer wall of the coupling bolt and configured to prevent the coupling bolt from being deviated in a second direction that is opposite to the first direction.

9. The male connector of claim 5, further comprising a plurality of coupling rods each protruding from the male flange in a direction opposite to a direction in which the male protrusion protrudes from the male flange, the plurality of coupling rods each having a different diameter and each configured to be aligned with one of the plurality of male taps.

10. A direct coupling connector assembly, comprising:
    a male connector mountable to a first module provided with a first printed circuit board, the male connector including a male connector body having a male flange and a male protrusion protruding from the male flange, a plurality of male taps penetrating the male connector body and connectable to the first printed circuit board, a coupling bolt connected to the male connector and rotatable in place, and a male O-ring disposed in the male flange; and
    a female connector mountable to a second module provided with a second printed circuit board, the female connector including a female connector body having a female flange and a female protrusion protruding from the female flange, a plurality of female taps each including a pin extending through the female connector body and connectable to the second printed circuit board and a receptor connected to an end of the pin, an inner seal disposed in the female protrusion and configured to be in contact with at least a portion of the male connector, a coupling nut disposed in the female connector body, a female O-ring disposed in an outer wall of the female protrusion, and a support protruding from a center of the female flange and supporting the coupling nut, the female protrusion includes an inner female protrusion separate from the support, surrounding an outer side of the support, and protruding from the female flange, and an outer female protrusion separate from the inner female protrusion and surrounding the inner female protrusion.

11. The direct coupling connector assembly of claim 10, wherein the inner seal includes a first seal part contacting an end of the male protrusion and a second seal part vertically extending from the first seal part and contacting an inner wall of the male protrusion.

12. The direct coupling connector assembly of claim 10, wherein the female connector includes a family seal inserted into the female connector body and elastically supporting the plurality of female taps, and a seal holder inserted into the female connector body, supporting the family seal, and supporting the plurality of female taps.

13. The direct coupling connector assembly of claim 10, wherein the male connector includes a coupling O-ring surrounding the coupling bolt, the coupling bolt includes a coupling groove extending into the coupling bolt in a direction perpendicular to a lengthwise direction of the coupling bolt and supporting the coupling O-ring.

14. The direct coupling connector assembly of claim 10, wherein the male connector includes a deviation preventer configured to prevent the coupling bolt from being deviated in a first direction relative to the male connector body, the coupling bolt includes a pressing portion formed on an outer wall of the coupling bolt and configured to prevent the coupling bolt from being deviated in a second direction that is opposite to the first direction.

15. The direct coupling connector assembly of claim 10, wherein the male protrusion includes an inner male protrusion separate from the coupling bolt, protruding from the male flange, and inserted into an inner side of the inner female protrusion, and an outer male protrusion inserted between the inner female protrusion and the outer female protrusion.

16. The direct coupling connector assembly of claim 15, wherein at least one of the male connector and the female connector includes a plurality of ribs inserted into the male connector or the female connector, and an interval between a first pair of neighboring ribs of the plurality of ribs is different from an interval between a second pair of neighboring ribs of the plurality of ribs.

* * * * *